United States Patent [19]
Nagata

[11] Patent Number: 6,114,981
[45] Date of Patent: Sep. 5, 2000

[54] D/A CONVERTER

[75] Inventor: Mitsuru Nagata, Kanagawaken, Japan

[73] Assignee: Kabushiki Kaisha Toshiba, Kawasakishi, Japan

[21] Appl. No.: 09/205,365

[22] Filed: Dec. 4, 1998

[30] Foreign Application Priority Data

Dec. 5, 1997 [JP] Japan ..................................... 9-336071

[51] Int. Cl.[7] .............................. H03M 3/00; H03M 1/66
[52] U.S. Cl. ........................................... 341/143; 341/144
[58] Field of Search ..................................... 341/143, 144

[56] References Cited

U.S. PATENT DOCUMENTS

| | | | |
|---|---|---|---|
| 5,594,443 | 1/1997 | Lam | 341/144 |
| 5,627,536 | 5/1997 | Ramirez | 341/143 |
| 5,821,891 | 10/1998 | Shi et al. | 341/143 |
| 5,835,043 | 11/1998 | Tsuchida et al. | 341/143 |

FOREIGN PATENT DOCUMENTS

| | | |
|---|---|---|
| 5-276048 | 10/1993 | Japan . |
| 7-297716 | 11/1995 | Japan . |
| 9-172375 | 6/1997 | Japan . |

Primary Examiner—Trong Phan
Attorney, Agent, or Firm—Oblon, Spivak, McCelland, Maier & Neustadt, P.C.

[57] ABSTRACT

There is provided an over-sampling D/A converter which has a mute function for fixing an average DC potential of an analog output signal to a predetermined potential, and comprises a $\Sigma \Delta$ modulator for receiving a multibit digital signal to which a DC offset value is added and then outputting a one-bit non-return-to-zero signal, a signal generator for receiving the non-return-to-zero signal and the clock signal, then generating a return-to-zero signal which is a logical multiplication of the non-return-to-zero signal and the clock signal and a complementary signal of the return-to-zero signal which is a logical addition of the non-return-to-zero signal and an inverted signal of the clock signal, and then adding the return-to-zero signal to the complementary signal of the return-to-zero signal to thus output a polar-return-to-zero signal, and an analog filter for receiving the polar-return-to-zero signal and then outputting an analog signal. Accordingly, because an average DC potential of an output signal at the time of the mute operation-ON is set substantially equal to the average DC potential of the output signal at the time of the mute operation-OFF, variation in the average DC potential in the output signal due to ON/OFF of the mute operation can be prevented. As a result, generation of audible click noises can be prevented.

20 Claims, 18 Drawing Sheets

D/A CONVERTER

BACKGROUND OF THE INVENTION

1. Field of the Invention

The present invention relates an over-sampling D/A converter for achieving a high S/N ratio and, more particularly, an over-sampling D/A converter which has a mute function at its output portion.

2. Description of the Related Art

In recent years, in the field of the D/A converter, an over-sampling D/A converter has been developed and employed in practical use. Such over-sampling D/A converter can achieve high conversion precision at a low conversion bit number based on the over-sampling technique in which a sampling frequency fs is set sufficiently higher than a signal frequency bandwidth fB. In particular, since the D/A converter using $\Sigma \Delta$ modulation (sigma-delta modulation) can get a sufficient S/N ratio (signal-to-noise ratio) at a relatively low over-sampling ratio, recently such D/A converter has become the mainstream of the audio D/A converter.

For example, followings may be listed as the over-sampling D/A converter. FIG. 1 is a block circuit diagram showing a configuration of the over-sampling D/A converter. As shown in FIG. 1, the D/A converter comprises a $\Sigma \Delta$ modulator 1, a PRZ signal generator 2, and an analog filter 3. FIG. 2 is a timing chart of a clock signal CK, an NRZ (non-return-to-zero) signal, an RZ (return-to-zero) signal, an RZn signal which is a complementary signal of the RZ signal, and a PRZ (polar-return-to-zero) signal in FIG. 1. Also, average DC potentials of respective signals are shown in FIG. 2.

Such D/A converter has a function for fixing its output potential at a constant potential, i.e., a mute function, at its output portion. Normally, the constant potential is a middle point potential (VDD/2) between the potential of the power supply voltage VDD and the potential of the ground voltage GND. Because of this mute operation, abnormal sounds being generated immediately after the power supply is turned ON until the system is shifted into its normal mode by the reset operation, abnormal sounds being generated when the digital input signal is brought temporarily into its abnormal state due to mode switching of the system, and the like can be prevented. In addition, since re-quantization noises which are peculiar to the $\Sigma \Delta$ modulator 1 shown in FIG. 1 and are generated in input of zero data can be suppressed by this mute operation, the S/N ratio can be improved.

FIG. 3 is a block circuit diagram showing a configuration of the over-sampling D/A converter having the mute function. This D/A converter is constructed by adding a mute circuit 19 to the PRZ signal generator 2 shown in FIG. 1. The mute circuit 19 is controlled by the mute signal. The mute circuit 19 is composed of an AND circuit 20 and a NAND circuit 21. The NAND circuit 21 receives an inverted signal of the mute signal and an inverted signal of the RZ signal, and then outputs an RZm signal. The AND circuit 20 receives the inverted signal of the mute signal and the RZn signal, and then outputs an RZnm signal.

Next, this mute operation will be explained with reference to FIG. 4 hereinbelow. FIG. 4 is a timing chart of the clock signal CK, the NRZ signal, the RZm signal, the RZnm signal, the PRZ signal, and the mute signal in FIG. 3. Also, average DC potentials of respective signals are shown in FIG. 4. When the mute operation is OFF, the mute signal is at the "L" level, i.e., the inverted signal of the mute signal is at the "H" level. In this case, the NAND circuit 21 outputs the input RZ signal as the RZm signal as it is. The AND circuit 20 also outputs the input RZn signal as the RZnm signal as it is. On the contrary, when the mute operation is ON, the mute signal is at the "H" level, i.e., the inverted signal of the mute signal is at the "L" level. In this case, the NAND circuit 21 outputs the RZm signal at a potential level of the power supply voltage VDD (i.e., "H" level) regardless of a value of the input RZ signal. The AND circuit 20 also outputs the RZnm signal at a potential level of the ground voltage GND (i.e., "L" level) regardless of a value of the input RZn signal. In this case, the PRZ signal which is a result of analog addition of the RZm signal and the RZnm signal is fixed at a middle point potential VDD/2 between the potential of the power supply voltage VDD and the potential of the ground voltage GND. As a result, the analog signal being output from the filter amplifier 18 can be fixed at the potential VDD/2.

FIG. 5 is a block circuit diagram showing another configuration of the over-sampling D/A converter having the mute function. In this D/A converter, an analog switch 22 for short-circuiting a feedback resistor element in a filter amplifier 18 is provided to the filter amplifier 18. Thus, a potential of the analog signal being output from the filter amplifier 18 is fixed at a reference potential of the filter amplifier 18 by opening/closing the analog switch 22. Normally, this reference potential is set at the middle point potential VDD/2 between the potential of the power supply voltage VDD and the potential of the ground voltage GND.

However, there has been a following problem in the D/A converters shown in FIGS. 3 and 5. That is, the D/A converters have had such a drawback that, if data being located near zero data are input into the $\Sigma \Delta$ modulator 1 in FIGS. 3 and 5, an idling pattern is generated to thus produce a strong beat, as shown in FIG. 6 (J. C. Candy, "A Use of Double Integration in Sigma Delta Modulation" IEEE Trans., Commun., vol.COM-33, pp.249–258, Mar. 1985). Normally, in order to prevent this beat, a technique for adding a DC offset to the input data of the $\Sigma \Delta$ modulator 1 in advance is employed, as shown in FIG. 7. A value which is out of a beat appearing region is selected as a DC offset value, as shown in FIG. 6, to thereby prevent generation of the beat. However, a voltage Vos of this DC offset appears at the output of the D/A converter inevitably. Thus, this voltage Vos of the DC offset causes variation of an output average DC potential of the D/A converter every ON/OFF of the above mute operation. As a result, an audible click noise is generated.

Next, variation of the output average DC potential, i.e., cause of generation of the audible click noise will be explained in detail hereinbelow. Here the explanation will be made with reference to the D/A converter shown in FIG. 3. For example, in case the zero data are input into the $\Sigma \Delta$ modulator 1, the NRZ signal is at the "H" level (VDD) or the "L" level (GND) with a probability of ½. As evident from FIG. 4, it can be understood that the RZm signal becomes the "H" level (VDD) with a probability of ¼ at the time when the mute operation is OFF. That is, the average DC potential of the RZm signal is VDD/4. A value obtained by adding the above voltage Vos to the average DC potential is input into an inverter circuit 14. Hence, an output average DC potential E1 of the inverter circuit 14 which outputs an inverted value of the above added value can be given by $$E1 = (\tfrac{3}{4})VDD - Vos \quad (1)$$

Similarly, an output average DC potential E2 of an inverter circuit 15 can be given by $$E2 = (1/4 + L) VDD - Vos \quad (2)$$

FIG. 8 shows an equivalent circuit of the above output average DC potential E1 of the inverter circuit 14, the output average DC potential E2 of an inverter circuit 15, and resistors 16, 17 (resistance value Ri) at the time of mute operation-OFF in FIG. 3. As shown in FIG. 8, when the Norton's theorem is applied sequentially, an output average DC potential E3 of the equivalent circuit, if viewed from an addition point between the resistor 16 and the resistor 17, can be given by $$E3 = (1/2 + L) VDD - Vos \quad (3)$$

If resistance values of respective resistor elements are set as shown in FIG. 9, an output average DC potential E4 of a filter amplifier 18 can be given based on the Eq. (3) as $$E4 = (1/2 + L) VDD + A \cdot Vos \quad (4)$$

Where A = Ro/Ri'.

On the contrary, when the mute operation is ON, the RZm signal is fixed at the "H" level (VDD) and the RZnm signal is fixed at the "L" level (GND). That is, the output potential E5 of the inverter circuit 14 is at the "L" level (GND), and the output potential E6 of the inverter circuit 15 is at the "H" level (VDD). FIG. 10 shows an equivalent circuit of the output average DC potential E5 of the inverter circuit 14, the output average DC potential E6 of the inverter circuit 15, and the resistor elements 16, 17 in FIG. 3. As shown in FIG. 10, if the Norton's theorem is applied, an output average DC potential E7 of the equivalent circuit, if viewed from an addition point between two resistor elements, can be given by $$E7 = (1/2 + L) VDD \quad (5)$$

In this case, the output average DC potential E4 of the filter amplifier 8 becomes equal to the above output average DC potential E7.

In this manner, in the D/A converter shown in FIG. 3, the output average DC potential E4 of the filter amplifier 8 is set to E4 = (1/2+L) VDD + A·Vos when the mute operation is OFF, while such output average DC potential E4 of the filter amplifier 8 is set to E4 = (1/2+L) VDD when the mute operation is ON. As a result, as shown in FIG. 11, variation in the output average DC potential of the filter amplifier 8 is caused according to ON/OFF of the mute operation. That is, an audible click noise is generated. Such generation of the audible click noise due to ON/OFF of the mute operation is the problem which will be caused similarly in the D/A converter shown in FIG. 5.

SUMMARY OF THE INVENTION

The present invention has been made in light of the above circumstances, and it is an object of the present invention to provide an over-sampling D/A converter capable of preventing variation in an average DC potential level of an analog output signal and also implementing a mute operation without generation of an audible click noise.

In order to achieve the above object, according to a first aspect of the present invention, there is provided an over-sampling D/A converter, comprising:

(a) a $\Sigma \Delta$ modulator for receiving a multibit digital signal to which a DC offset value is added, and outputting a first one-bit digital signal;

(b) a signal generator for receiving the first one-bit digital signal and a clock signal, generating a second digital signal, which is a logical multiplication of the first one-bit digital signal and the clock signal, and a third digital signal, which is a logical addition of the first one-bit digital signal and an inverted signal of the clock signal, and adding the second digital signal to the third digital signal to thus output a fourth digital signal; and (c) an analog filter for receiving the fourth digital signal and outputting an analog signal;

wherein the analog filter includes a mute unit which short-circuits a feedback resistor element in a filter amplifier constituting the analog filter and sets a potential of the analog signal as a reference potential of the filter amplifier, and the reference potential is set substantially equal to an average DC potential of the fourth digital signal.

According to the first aspect of the present invention, since the mute unit can short-circuit the feedback resistor element of the filter amplifier to thus fix the output signal of the filter amplifier to the reference potential of the filter amplifier, the mute operation is turned ON. In addition, since the reference potential is set to the average DC potential of the digital signal, the average DC potential of the output signal of the filter amplifier is not varied. In other words, regardless of ON/OFF of the mute operation, the output signal of the filter amplifier corresponds to the average DC potential of the fourth digital signal. As a result, generation of the audible click noise can be prevented.

In order to achieve the above object, according to a second aspect of the present invention, there is provided an over-sampling D/A converter, comprising:

(a) a $\Sigma \Delta$ modulator for receiving a multibit digital signal to which a DC offset value is added, and outputting a first one-bit digital signal;

(b) a signal generator for receiving the first one-bit digital signal and a clock signal, generating a second digital signal, which is a logical multiplication of the first one-bit digital signal and the clock signal, and a third digital signal, which is a logical addition of the first one-bit digital signal and an inverted signal of the clock signal, and adding the second digital signal to the third digital signal to thus output a fourth digital signal; and (c) an analog filter for receiving the fourth digital signal and outputting an analog signal;

wherein the signal generator has a first mute unit which sets the second digital signal to a first potential and the third digital signal to a second potential and fixes the fourth digital signal at a predetermined potential, the predetermined potential being set substantially equal to an average DC potential of the fourth digital signal, the analog filter includes a second mute unit which short-circuits a feedback resistor element in a filter amplifier constituting the analog filter and sets a potential of the analog signal as a reference potential of the filter amplifier, and the reference potential is set substantially equal to the average DC potential of the fourth digital signal.

According to the second aspect of the present invention, when the mute operation is ON, first the second mute unit can short-circuit the feedback resistor element of the filter amplifier to thus fix the output signal of the filter amplifier to the reference potential of the filter amplifier, and therefore the second mute operation is turned ON. Subsequently, the first mute unit can set the second digital signal to the first potential and also set the third digital signal to the second potential to thus fix the fourth digital signal to the predetermined potential, and therefore the first mute operation is turned ON. In contrast, when the mute operation is OFF, at first the first mute operation is turned OFF, and then the second mute operation is turned OFF. As a result, the very high performance mute function can be implemented. In other words, since the first mute operation is executed by the output portion of the ΣΔ modulator, the click sounds due to re-quantization noise peculiar to the ΣΔ modulator are generated by the ON/Off of the first mute operation. On the contrary, since the second mute operation is carried out by short-circuiting the feedback resistor element of the filter amplifier, the filter amplifier has a very small gain. For this reason, the output of the D/A converter cannot be perfectly shut off in the filter amplifier. According to the second aspect of the present invention, the perfect mute operation can be executed by carrying out the first mute operation and the second mute operation at the above timings.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 10 is a circuit diagram showing an equivalent circuit of an output average DC potential E5 of the inverter circuit 14, an output average DC potential E6 of the inverter circuit 15, and the resistor elements 16, 17 in FIG. 3 when the mute operation is ON;

FIG. 15 is a circuit diagram showing an equivalent circuit of an output average DC potential E11 of the inverter circuit 14, an output average DC potential E12 of the inverter circuit 15, and the resistor elements 16a, 16b, 17a in FIG. 12 when the mute operation is ON;

FIG. 18 is a circuit diagram showing an equivalent circuit of an output average DC potential E17 of the inverter circuit 14, an output average DC potential E18 of the inverter circuit 15, and the resistor elements 16a, 16b, 17a in FIG. 16 when the mute operation is ON;

DESCRIPTION OF THE PREFERRED EMBODIMENTS

Figure 1:
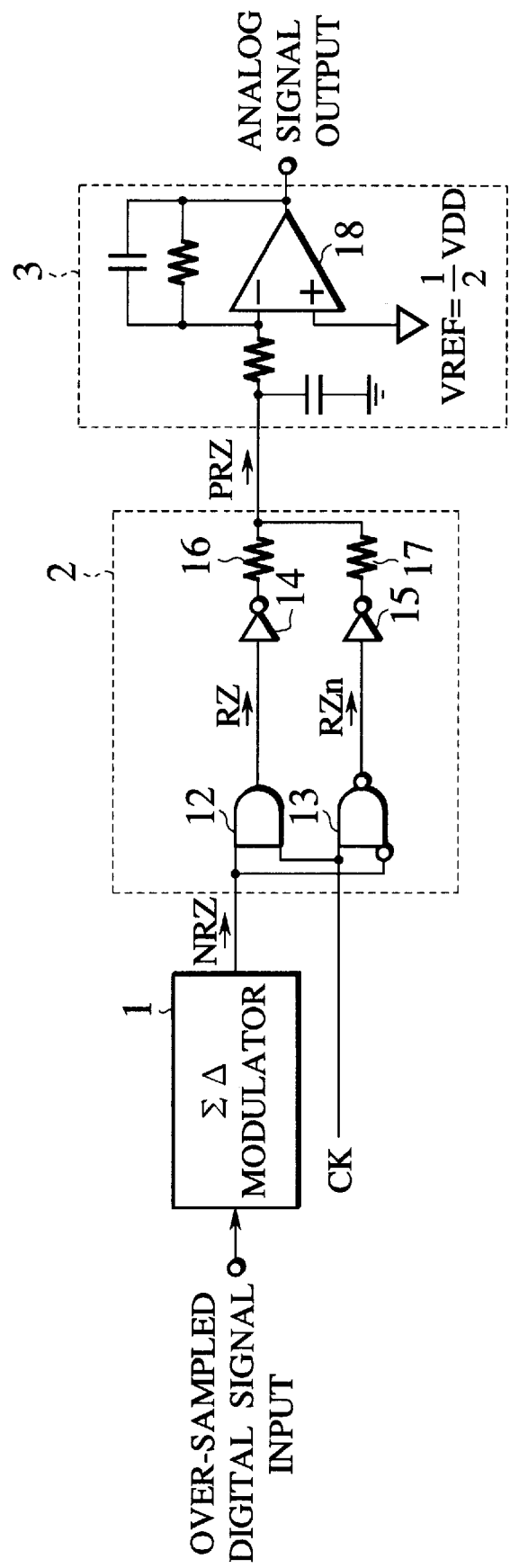
FIG. 1 is a block circuit diagram showing a configuration of a normal over-sampling D/A converter.
Figure 2:
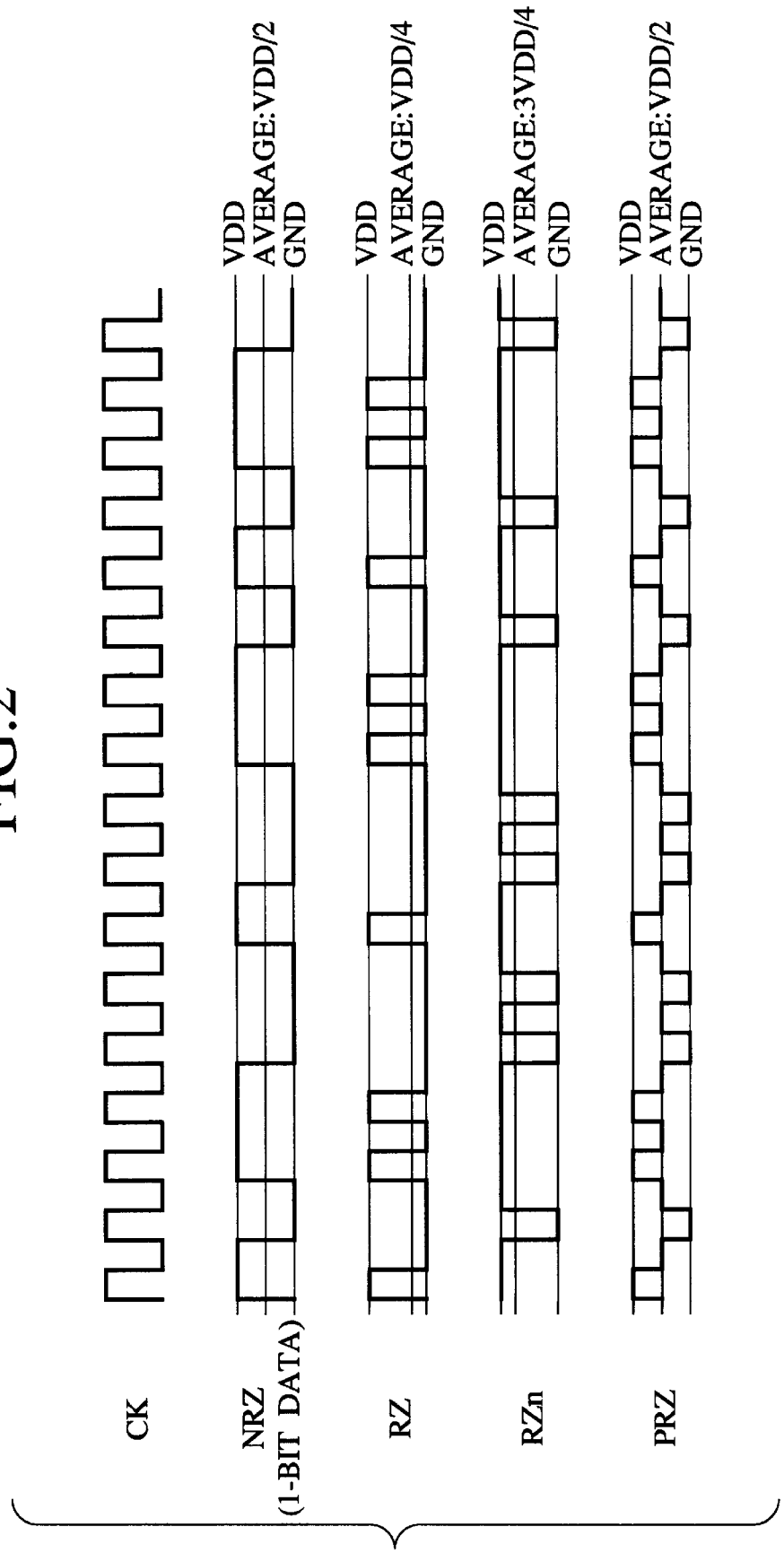
FIG. 2 is a timing chart of a clock signal, an NRZ signal, an RZ signal, an RZn signal, and a PRZ signal in FIG. 1.
Figure 3:
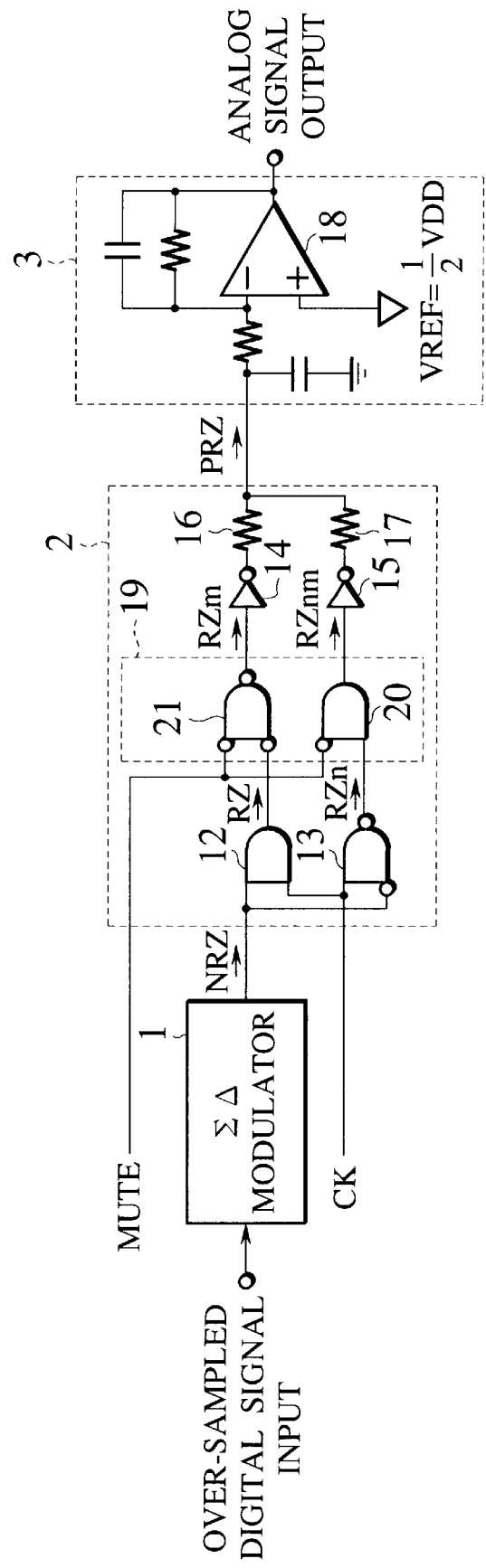
FIG. 3 is a block circuit diagram showing a configuration of an over-sampling D/A converter having a normal mute function.
Figure 4:
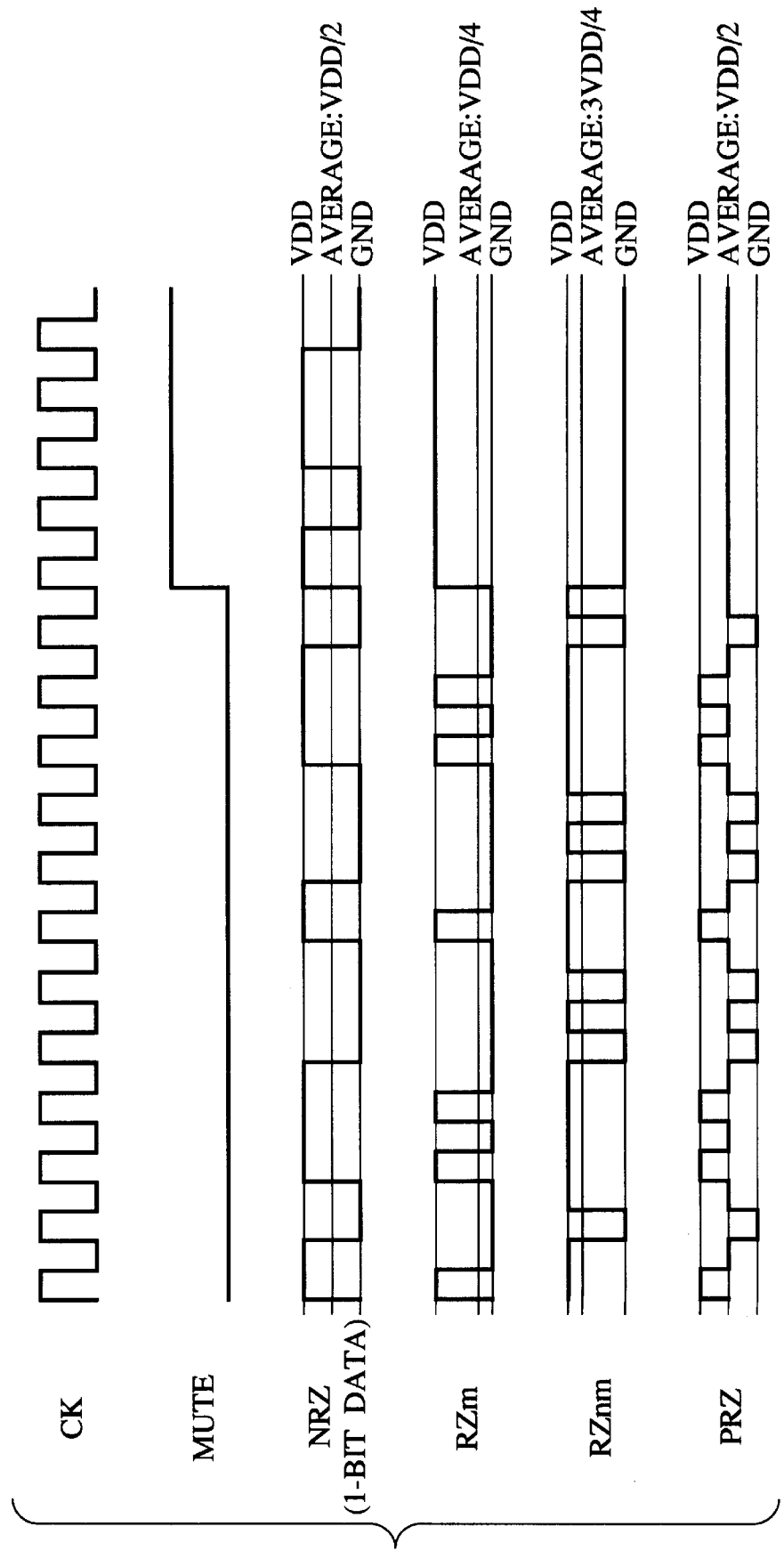
FIG. 4 is a timing chart of a clock signal, a mute signal, an NRZ signal, an RZm signal, an RZnm signal, and a PRZ signal in FIG. 3.
Figure 5:
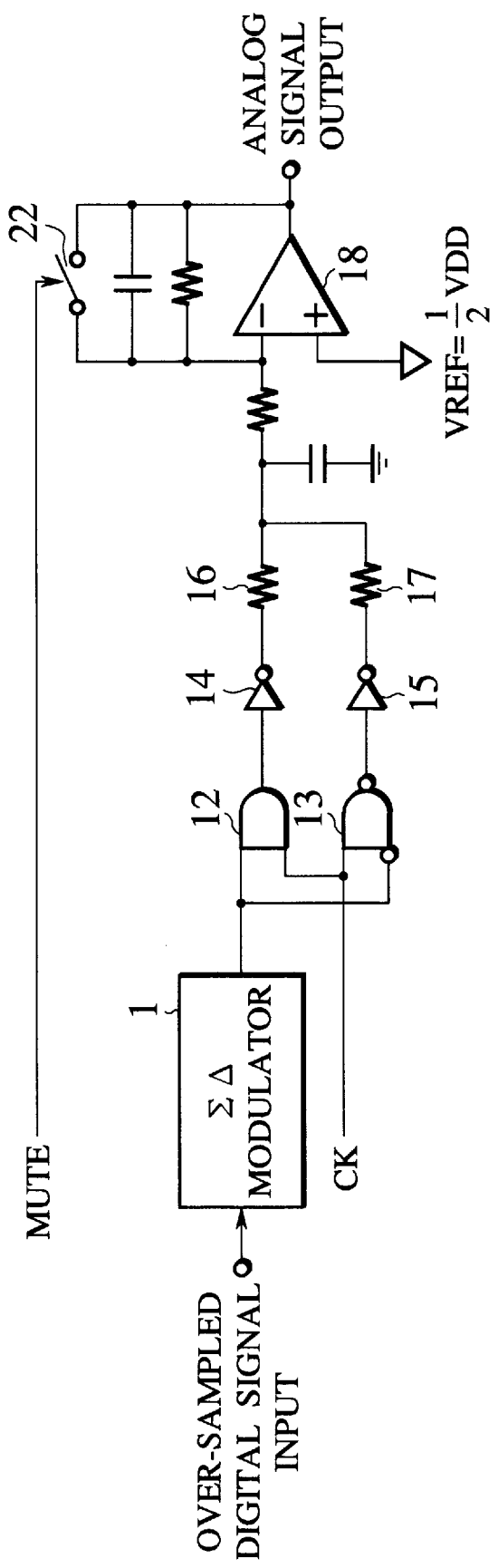
FIG. 5 is a block circuit diagram showing another configuration of an over-sampling D/A converter having a normal mute function.
Figure 6:
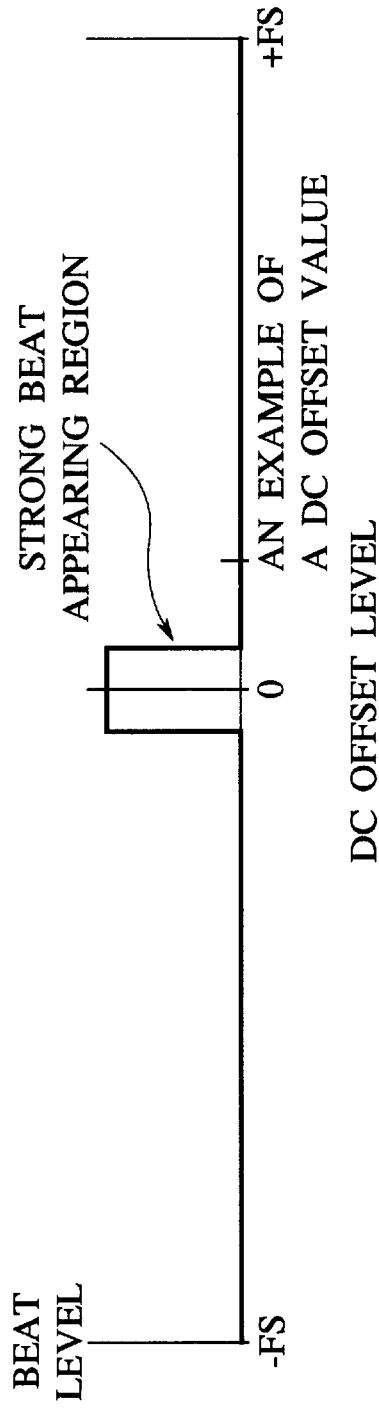
FIG. 6 is a view showing a problem caused by the D/A converters shown in FIGS. 3 and 5.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(FIRST EMBODIMENT)

Figure 12:
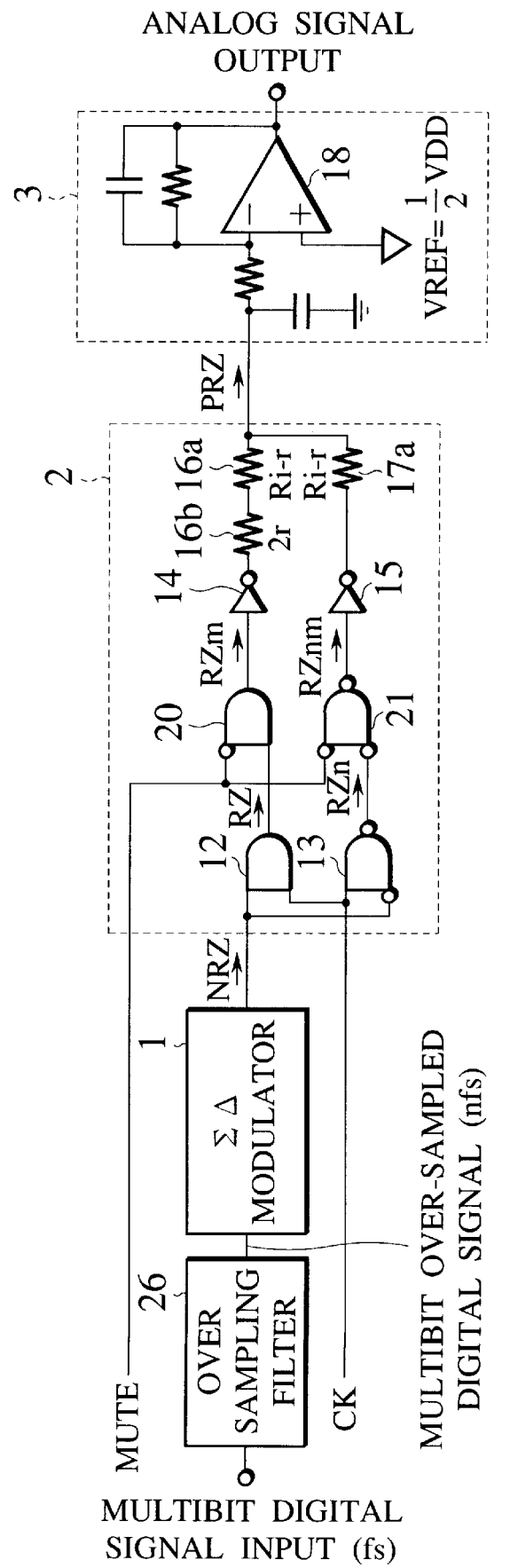
FIG. 12 is a block circuit diagram showing a configuration of an over-sampling D/A converter according to a first embodiment of the present invention.

FIG. 12 is a block circuit diagram showing a configuration of an over-sampling D/A converter according to a first embodiment of the present invention. Same references are labeled onto elements which are common to the related art described above. This D/A converter comprises an over-sampling filter 26, a ΣΔ modulator 1, a PRZ (polar-return-to-zero) signal generator 2, and an analog filter 3.

Figure 13:
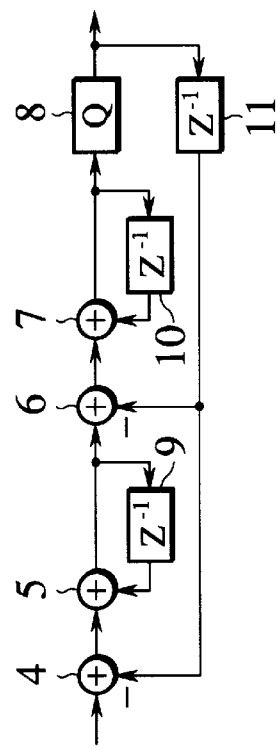
FIG. 13 is a circuit diagram showing an example of a configuration of a ΣΔ modulator in FIG. 12.

The over-sampling filter 26 receives a multibit digital signal input and then outputs a multibit over-sampled digital signal which is over-sampled at a frequency being n times (normally, n is 32 to 512) a sampling frequency. The ΣΔ modulator 1 receives the multibit over-sampled digital signal from the over-sampling filter 26. Then, the ΣΔ modulator 1 quantizes the received multibit over-sampled digital signal into one bit and then outputs an NRZ (non-return-to-zero) signal by one bit. FIG. 13 is a circuit diagram showing an example of a configuration of the ΣΔ modulator 1 in FIG. 12. As shown in FIG. 13, this second-order ΣΔ modulator 1 is constructed by connecting in series a subtractor 4, an integrator consisting of an adder 5 and a delay circuit 9, a subtractor 6, an integrator consisting of an adder 7 and a delay circuit 10, and a quantizer 8, so that an output signal of the quantizer 8 is supplied to the subtractors 4, 6 via a delay circuit 11.

The PRZ signal generator 2 receives an NRZ signal being output from the ΣΔ modulator 1 and then generates a PRZ signal. If the NRZ signal is input into a filter amplifier 8 as it is, a number of second-order harmonics are generated from the filter amplifier 8 because of rounded rising/falling waveforms of the NRZ signal. Hence, the PRZ signal generator 2 converts the NRZ signal into the PRZ signal which has less waveform distortion, and then inputs the PRZ signal into the filter amplifier 8. The PRZ signal generator 2 comprises an AND circuit 12 for receiving the NRZ signal being output from the ΣΔ modulator 1 and the clock signal CK and then outputting the RZ signal, a NAND circuit 13 for receiving an inverted signal of the NRZ signal and the clock signal CK and then outputting an RZn signal being a complementary signal of the RZ signal, an AND circuit 20 for receiving both an inverted signal of the mute signal and an inverted signal of the RZ signal and then outputting an RZm signal, a NAND circuit 21 for receiving both the inverted signal of the mute signal and an inverted signal of the RZn signal and then outputting an RZnm signal, an inverter 14 and resistor elements 16a, 16b acting as a feature of the present invention, both are connected in series with the AND circuit 20, and an inverter 15 and a resistor 17a acting as a feature of the present invention, both are connected in series with the NAND circuit 21. The PRZ signal generator 2 adds the RZm signal to the RZnm signal in an analog fashion to thus generate the PRZ signal. The RZ signal may be formed of a logical multiplication of the NRZ signal and the clock signal. The RZn signal may be formed of a logical addition of the NRZ signal and an inverted signal of the clock signal. Hence, the AND circuit 20 and the NAND circuit 21 are employed as output logical circuits in this disclosure, but such logical circuits are not limited to them.

The analog filter 3 receives the PRZ signal being output from the PRZ signal generator 2, and then outputs an analog signal via the filter amplifier 18.

In the D/A converter constructed as above according to the first embodiment, resistance values of the resistor elements 16a, 16b being connected to the inverter circuit 14 are set differently from a resistance value of the resistor element 17a being connected to the inverter circuit 15. More particularly, as shown in FIG. 12, in the PRZ signal generator 2 of the D/A converter, the resistor element 16a and the resistor element 16b are connected in series to an output terminal of the inverter circuit 14, and the resistor element 17a is connected to an output terminal of the inverter circuit 15. Then, resistance values of the resistor elements 16a, 17a are set to Ri-r, a resistance value of the resistor element 16b is set to 2r, and a resistance value of the equivalent resistor is set substantially to Ri/2. Where Ri denotes resistance values of the resistor elements 16, 17 in FIG. 1. In the first embodiment, according to the DC offset value which is added to an input signal of the ΣΔ modulator 1, the resistance values of the resistor elements connected to the inverter circuits 14, 15 can be adjusted. As a result, variation in the output average DC potential of the filter amplifier 18 can be suppressed even if ON/OFF of the mute operation is effected.

Figure 7:
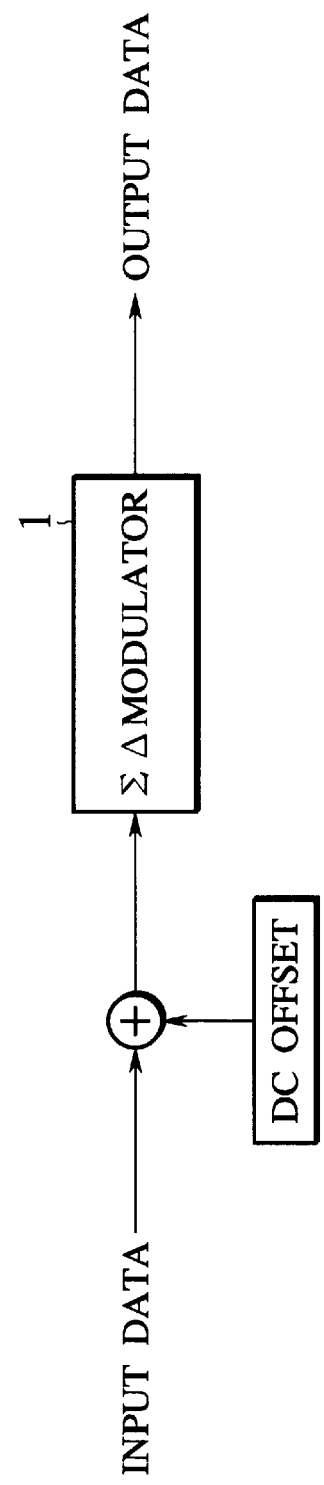
FIG. 7 is a view showing a DC offset added to input data of ΣΔ modulators shown in FIGS. 3 and 5.

Next, a method of calculating the resistance values of these resistor elements 16a, 16b, 17 and an effect of these resistor elements will be explained hereinbelow. In this case, assume that the DC offset described in FIG. 7 is added to the digital signal which is supplied to the ΣΔ modulator 1. To begin with, in case the mute operation is OFF, when the zero data are input into the ΣΔ modulator 1, the NRZ signal becomes the "H" level (VDD) or the "L" level (GND) with a probability of $\frac{1}{2}+L$. Then, the RZm signal becomes the "H" level (VDD) with a probability of $\frac{1}{4}+L$. Thus, the average DC potential of the RZm signal becomes VDD/4. The value is derived by adding the above DC offset voltage Vos to the average DC potential is output to the resistor elements 16a, 16b via the inverter circuit 14. Then, the output average DC potential E8 of the inverter circuit 14 can be given by $$E8 = (\tfrac{3}{4}+L)VDD - Vos \qquad (6)$$

Similarly, the output average DC potential E9 of the inverter circuit 15 can be given by $$E9 = (\tfrac{1}{4}+L)VDD - Vos \qquad (7)$$

Figure 14:
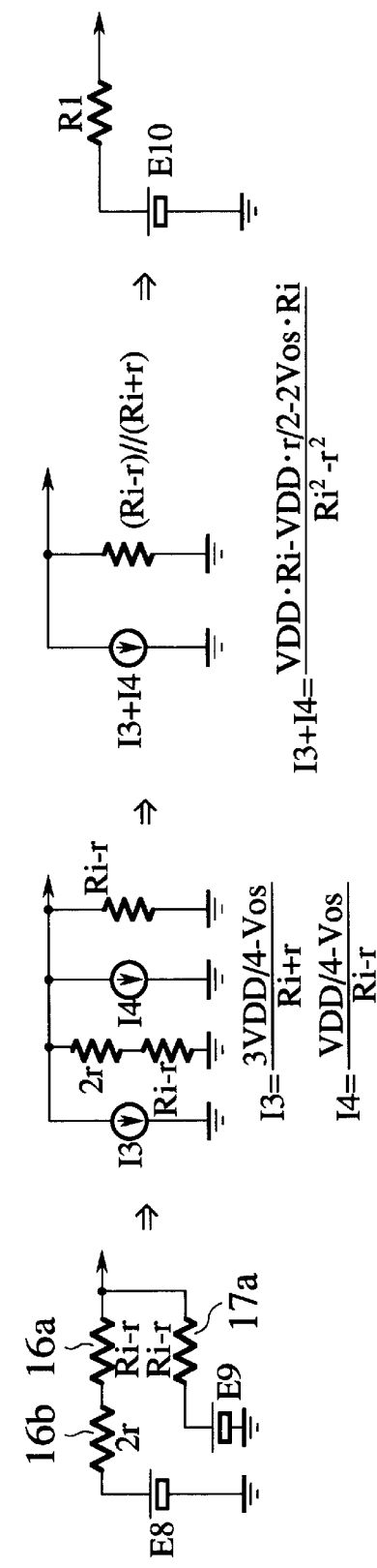
FIG. 14 is a circuit diagram showing an equivalent circuit of an output average DC potential E8 of the inverter circuit 14, an output average DC potential E9 of the inverter circuit 15, and resistor elements 16a, 16b, 17a in FIG. 12 when the mute operation is OFF.

FIG. 14 shows an equivalent circuit of the output average DC potential E8 of the inverter circuit 14, the output average DC potential E9 of the inverter circuit 15, and resistor elements 16a, 16b, 17a in FIG. 12 when the mute operation is OFF. As shown in FIG. 14, if the Norton's theorem is applied, an output average DC potential E10 of the equivalent circuit and a resistance value R1 of the equivalent resistor, if viewed from an addition point between two resistor elements 16a, 17a, can be given by $$E10 = (\tfrac{1}{2}+L)VDD - Vos - (\alpha/4)VDD \qquad (8)$$

$$R1 = (Ri/2)\cdot(1-\alpha^2) \qquad (9)$$

where $\alpha = r/Ri$.

Figure 15:
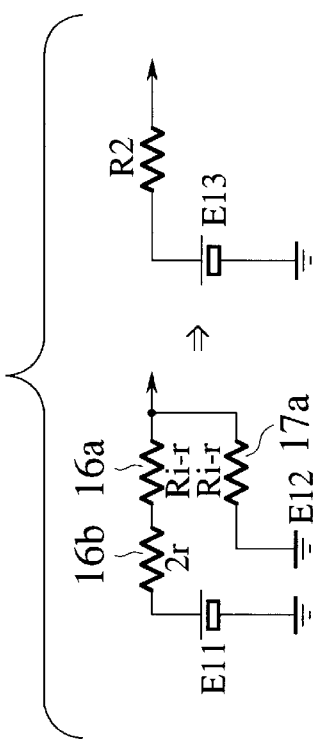

In contrast, in case the mute operation is ON, the RZm signal is at the "L" level (GND) and the RZnm signal is at the "H" level (VDD). That is, an output average DC potential E11 of the inverter circuit 14 becomes the "H" level (VDD), while an output average DC potential E12 of the inverter circuit 15 becomes the "L" level (GND). FIG. 15 shows an equivalent circuit of the output average DC potential E11 of the inverter circuit 14, the output average DC potential E12 of the inverter circuit 15, and resistor elements 16a, 16b, 17a in FIG. 12 when the mute operation is ON. As shown in FIG. 15, if the Norton's theorem is applied, an output average DC potential E13 of the equivalent circuit, if viewed from an addition point between the resistor elements 16a, 17a, can be given by $$E13 = (\tfrac{1}{2}+L)VDD - (\alpha/2)VDD \qquad (10)$$

Because of the variation in the output average DC potential generated by ON/OFF of the mute operation, the above audible click noise is caused. Accordingly, if the output average DC potential E10 obtained when the mute operation is OFF coincides with the output average DC potential E13 obtained when the mute operation is ON, there is no variation in the output average DC potential generated by ON/OFF of the mute function. As a result, generation of the audible click noise can be prevented.

If the output average DC potentials E10=E13 are set according to Eq.(8) and Eq.(10), $$(\tfrac{1}{2}+L)VDD - Vos - (\alpha/4)VDD = (\tfrac{1}{2}+L)VDD - (\alpha/2)VDD \qquad (11)$$

If Eq. (11) is solved with respect to r by substituting $\alpha = r/Ri$ into Eq. (11), $$r = 4 \text{Vos} \cdot (Ri/VDD) \quad (12)$$

At this time, the output average DC potentials E10, E13 can be given by $$E10 = E13 = (\tfrac{1}{2} + L) VDD - 2Vos$$

If r to satisfy Eq. (12) is calculated and then the resistance values of the resistor elements which are connected to the inverter circuits 14, 15 are set, the variation in the output average DC potential due to ON/OFF of the mute operation can be prevented. As a result, generation of the audible click noise can be eliminated.

(SECOND EMBODIMENT)

Figure 16:
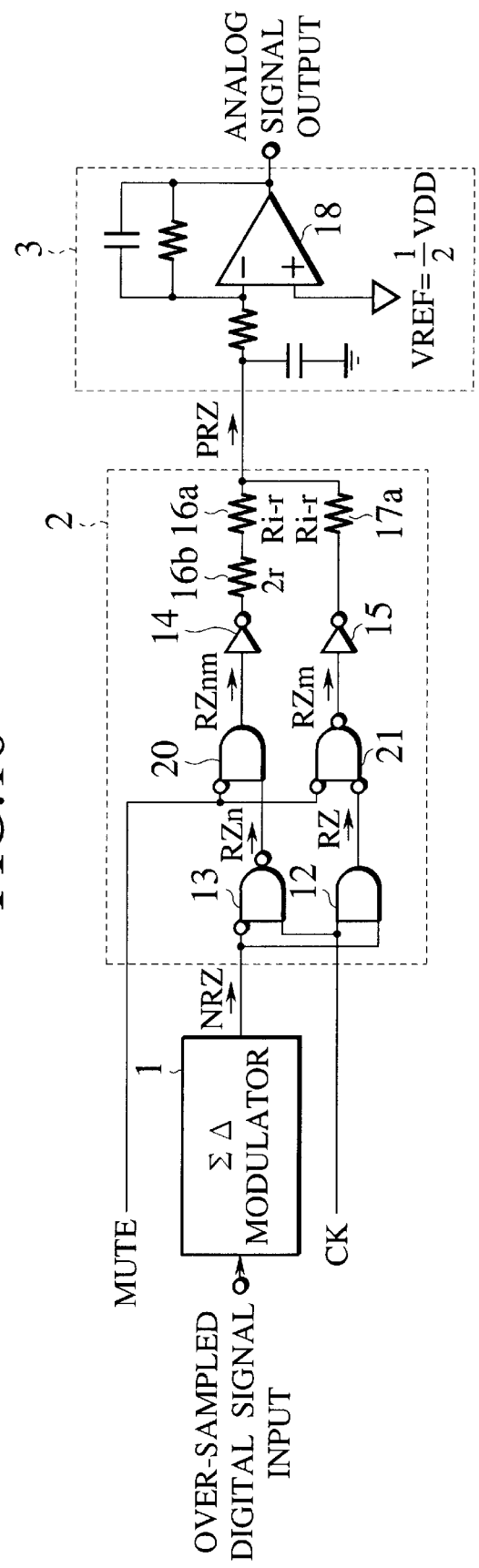
FIG. 16 is a block circuit diagram showing a configuration of an over-sampling D/A converter according to a second embodiment of the present invention.

Next, a second embodiment of the present invention will be explained hereinbelow. FIG. 16 shows a configuration of an over-sampling D/A converter according to the second embodiment of the present invention. Same references are labeled onto elements which are common to the related art described above. In the second embodiment of the present invention, the RZ signal and the RZn signal being generated in the PRZ signal generator 2 in the first embodiment shown in FIG. 12 are replaced with each other. Like the above first embodiment, an effect of the resistor elements which are set to different resistor values will be explained hereinbelow. In this case, assume that the DC offset explained in FIG. 7 is also added onto the digital signal which is supplied to the Σ Δ modulator 1.

If the similar consideration in the above first embodiment is applied, an output average DC potential E14 of the inverter circuit 14 obtained when the mute operation is OFF can be given by $$E14 = (\tfrac{1}{4} + L) VDD - Vos \quad (13)$$

In contrast, an output average DC potential E15 of the inverter circuit 15 can be given by $$E15 = (\tfrac{3}{4} + L) VDD - Vos \quad (14)$$

Figure 17:
FIG. 17 is a circuit diagram showing an equivalent circuit of an output average DC potential E14 of the inverter circuit 14, an output average DC potential E15 of the inverter circuit 15, and resistor elements 16a, 16b, 17a in FIG. 16 when the mute operation is OFF.

FIG. 17 shows an equivalent circuit of the output average DC potential E14 of the inverter circuit 14, the output average DC potential E15 of the inverter circuit 15, and resistors 16a, 16b, 17a in FIG. 16 when the mute operation is OFF. As shown in FIG. 17, if the Norton's theorem is applied, an output average DC potential E16 of the equivalent circuit and a resistance value R3 of the equivalent resistor, if viewed from an addition point between the resistor elements 16a, 17a, can be given by $$E16 = (\tfrac{1}{2} + L) VDD - Vos + (\alpha/4) VDD \quad (15)$$

$$R3 = (Ri/2) \cdot (1 - \alpha^2) \quad (16)$$

Where α=r/Ri.

Figure 18:

In contrast, like the first embodiment, as shown in FIG. 18, when the mute operation is ON, an output average DC potential E19 of the equivalent circuit, if viewed from an addition point between the resistor elements 16a, 17a, can be given by $$E19 = (\tfrac{1}{2} + L) VDD - (\alpha/2) VDD \quad (17)$$

If Eq. (15)=Eq. (17) is set, $$r = (4/3) Vos \cdot (Ri/VDD) \quad (18)$$

In this fashion, if r is set to satisfy the above Eq. (18), the variation in the output average DC potential can be prevented and thus generation of the audible click noise can be eliminated.

(THIRD EMBODIMENT)

Figure 19:
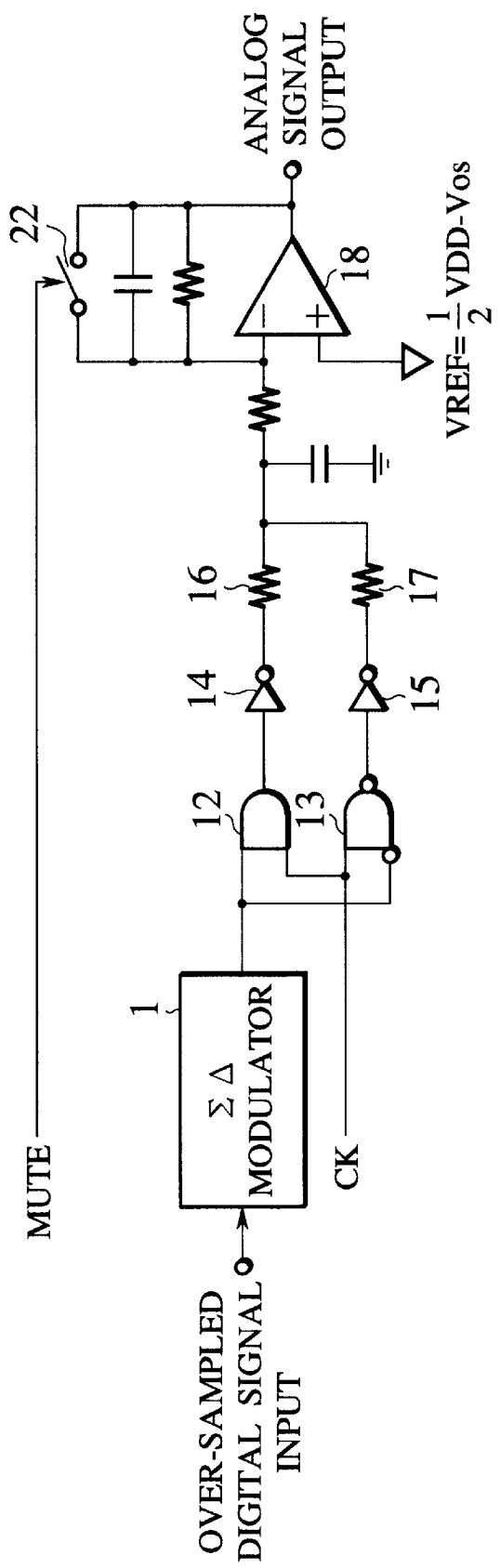
FIG. 19 is a block circuit diagram showing a configuration of an over-sampling D/A converter according to a third embodiment of the present invention.
Figure 20:
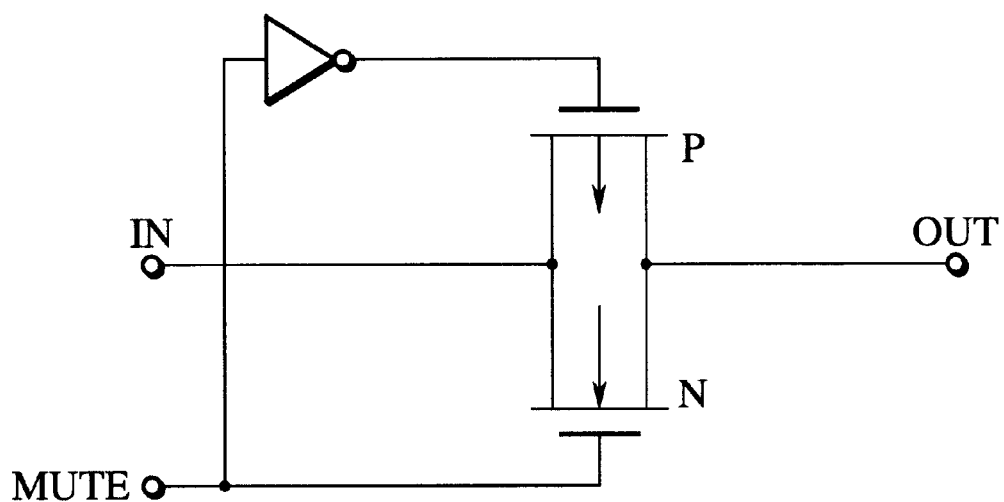
FIG. 20 is a circuit diagram showing an example of a configuration of an analog switch 22 in FIG. 19.

Next, a third embodiment of the present invention will be explained hereinbelow. FIG. 19 shows a configuration of an over-sampling D/A converter according to the third embodiment of the present invention. Same references are labeled onto elements which are common to the related art described above. In the third embodiment of the present invention, this D/A converter comprises the Σ Δ modulator 1, the PRZ signal generator 2, and the analog filter 3. In the D/A converter, an analog switch 22 for short-circuiting the feedback resistor element in the filter amplifier 18 is provided to the filter amplifier 18. Thus, an analog signal being output from the filter amplifier 18 can be fixed at a reference potential of the filter amplifier 18 by opening/closing the analog switch 22. FIG. 20 is a circuit diagram showing an example of a configuration of the analog switch 22 in FIG. 19. The analog switch 22 is composed of a transmission gate which is constructed by connecting a p-type MOS transistor and an n-type MOS transistor in parallel across the feedback resistor element. This transmission gate has features that a symmetrical bi-directional transmission characteristic can be achieved and that there is no loss of the signal voltage caused in passing the signal therethrough. If the transmission gate is employed as the analog switch 22, both MOS transistors are turned ON when the mute signal is at the "H" level, so that the transmission gate is brought into its conductive state. In contrast, both MOS transistors are turned OFF when the mute signal is at the "L" level, so that the transmission gate is brought into its non-conductive state.

Figure 8:
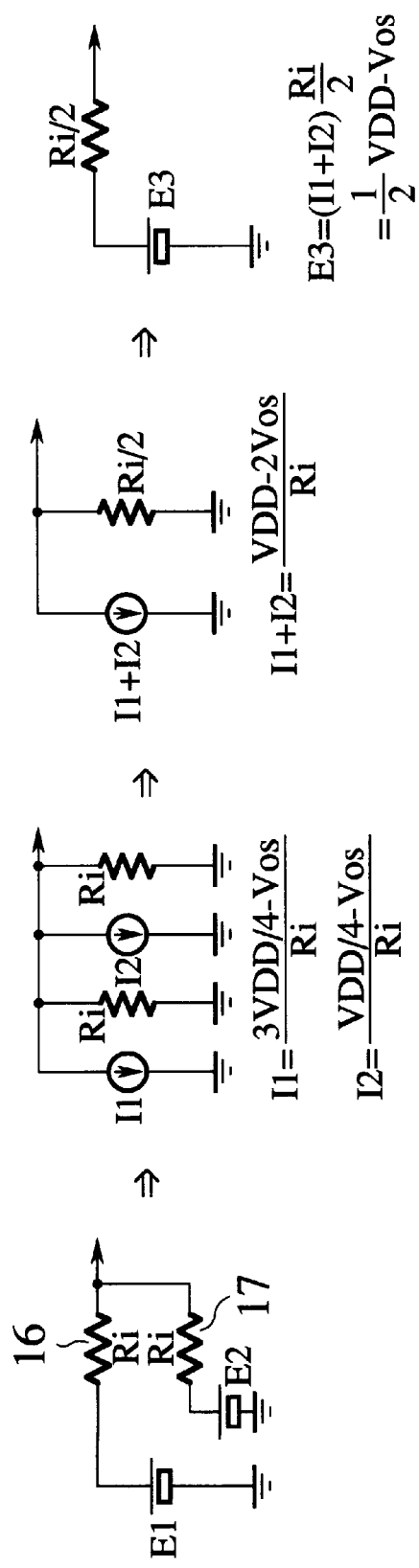
FIG. 8 is a circuit diagram showing an equivalent circuit of an output average DC potential E1 of an inverter circuit 14, an output average DC potential E2 of an inverter circuit 15, and resistor elements 16, 17 in FIG. 3 when a mute operation is OFF.
Figure 9:
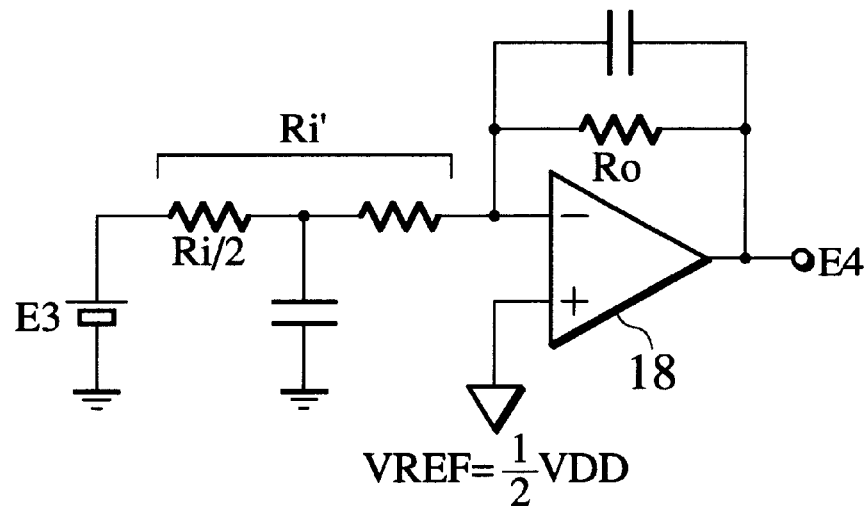
FIG. 9 is a circuit diagram showing a resistance value of a resistor element connected to a filter amplifier 18 in FIG. 3.
Figure 10:
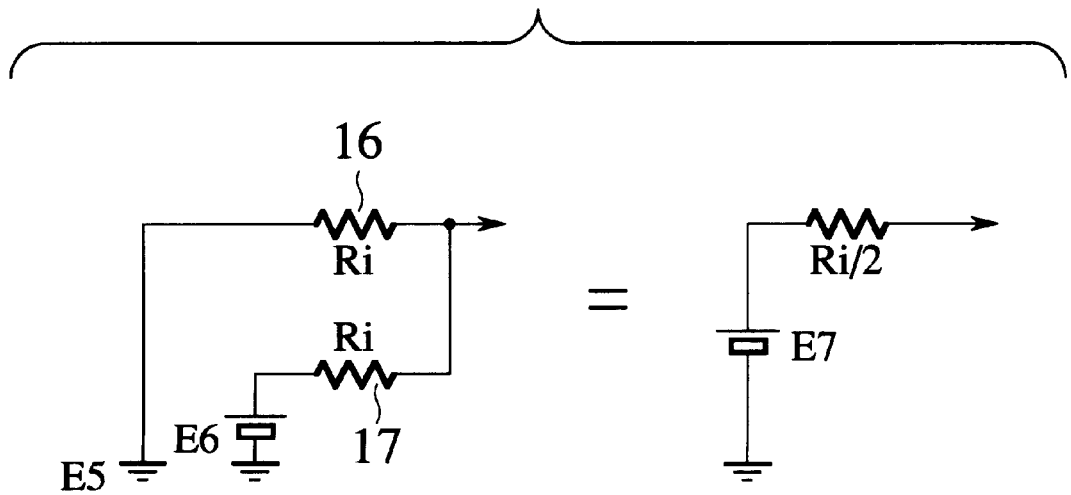
Figure 11:
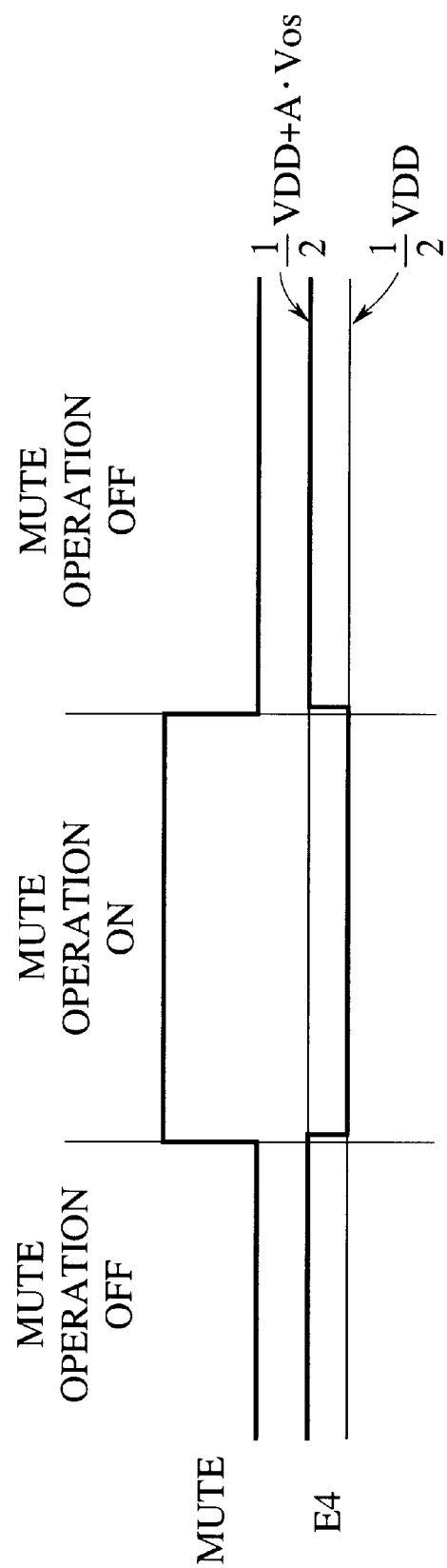
FIG. 11 is a view showing an audible click noise generated by the mute operation ON/OFF.

In the third embodiment, the variation in the output average DC potential of the filter amplifier 18 caused by ON/OFF of the mute operation can be prevented by setting a reference potential VREF of the filter amplifier 18 to (½+L)VDD−Vos. As shown in FIG. 8, in case the mute operation is OFF, i.e., in case the analog switch 22 is in its non-conductive state, the average DC potential which is supplied to the filter amplifier 18 becomes (½+L)VDD−Vos. Accordingly, if the reference potential of the filter amplifier 18 is also set to (½+L)VDD−Vos, the average DC potential which is supplied to the filter amplifier 18 becomes equal to the reference potential of the filter amplifier 18. Consequently, the output average DC potential of the filter amplifier 18 becomes (½+L)VDD−Vos. On the contrary, in case the mute operation is ON, i.e., in case the analog switch 22 is in its conductive state, the feedback resistor element of the filter amplifier 18 is short-circuited. Therefore, the output average DC potential of the filter amplifier 18 becomes (½+L)VDD−Vos.

In this way, in either case where the mute operation is ON or OFF, the output average DC potential of the filter amplifier 18 is set to (½+L)VDD−Vos. In other words, the variation in the output average DC potential because of ON/OFF of the mute operation can be eliminated and thus the audible click noise is not generated.

Figure 21:
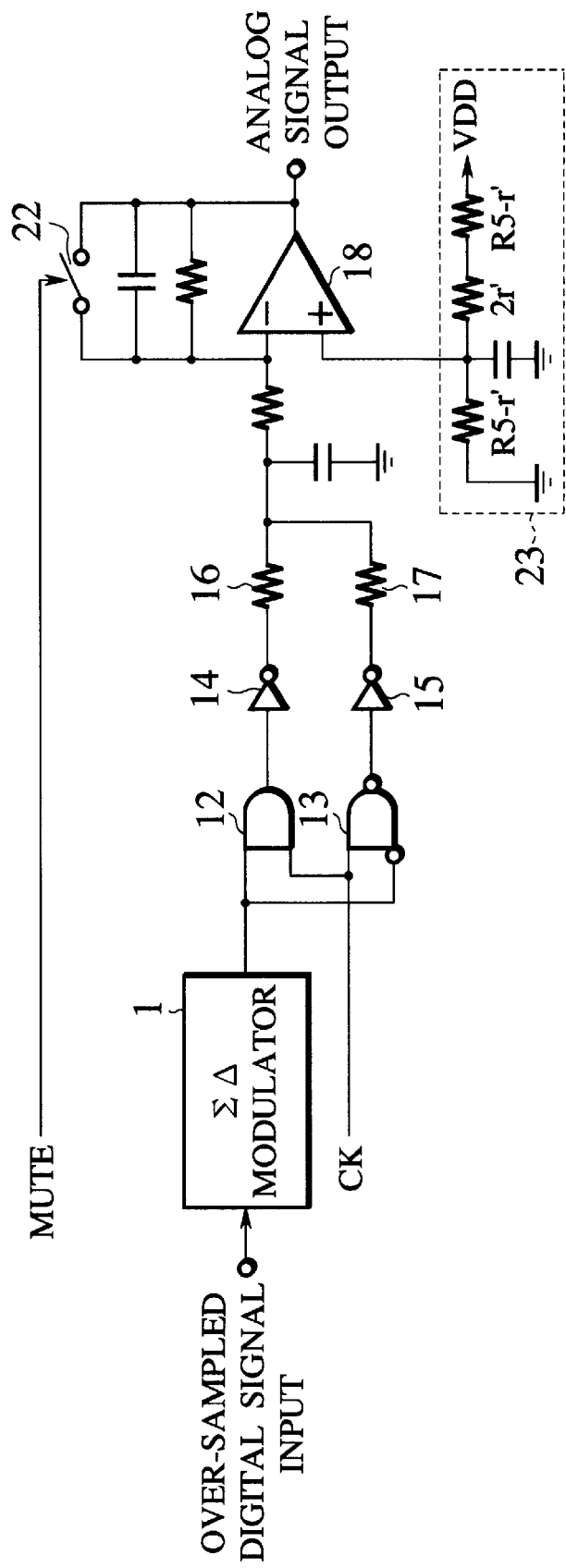
FIG. 21 is a circuit diagram showing an example of a configuration of a reference potential generator for generating a reference potential in FIG. 19.

The reference potential of the filter amplifier 18 can be generated by a reference potential generator 23 as shown in FIG. 21, for example. According to this circuit configuration, the reference potential VREF can be given by $$VREF = [(R5 - r')/2 \cdot R5] VDD \quad (19)$$

$$= (1/2) VDD - (\beta/2) VDD$$

Where β=r'/R5. Accordingly, r' by which the reference potential is made equal to VDD−Vos can be given by $$(\tfrac{1}{2} + L) VDD - (\beta/2) VDD = (\tfrac{1}{2} + L) VDD - Vos$$

$$(\beta/2)VDD=Vos$$

$$\therefore \beta=2Vos/VDD$$

$$\therefore r'=(2Vos/VDD)R5 \qquad (20)$$

(FOURTH EMBODIMENT)

Figure 22:
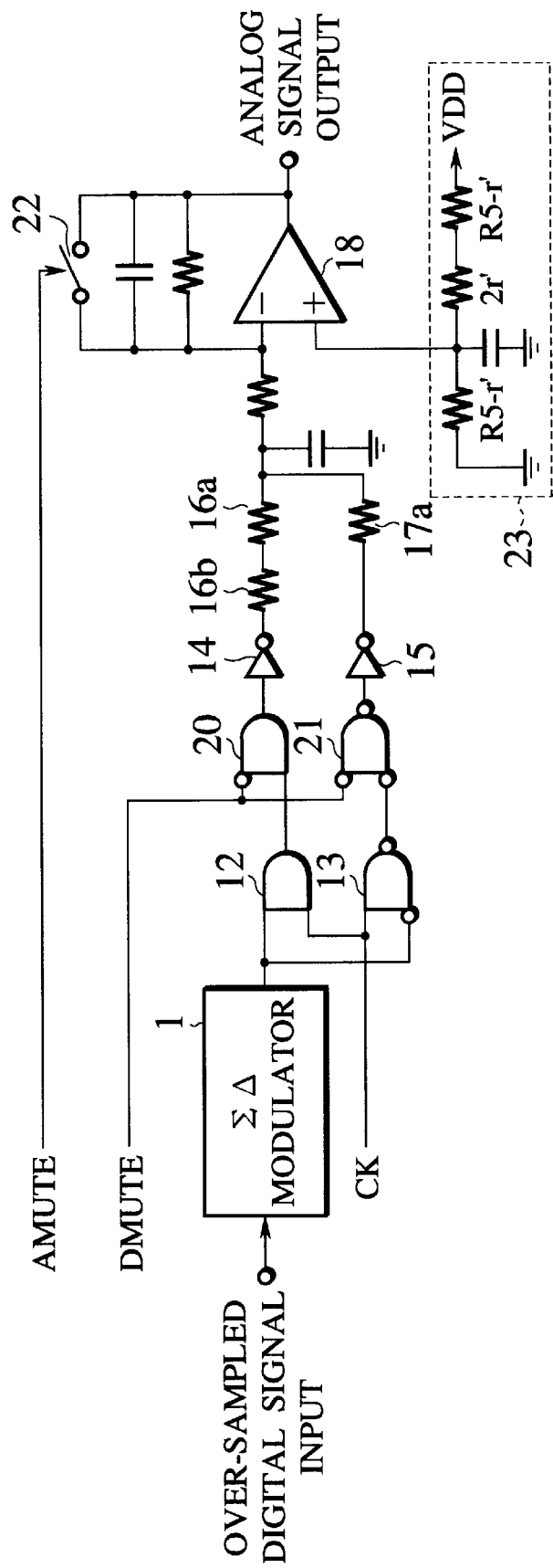
FIG. 22 is a block circuit diagram showing a configuration of an over-sampling D/A converter according to a fourth embodiment of the present invention.

Next, a fourth embodiment of the present invention will be explained hereinbelow. FIG. 22 shows a configuration of an over-sampling D/A converter according to the fourth embodiment of the present invention. Same references are labeled onto elements which are common to the related art described above. The fourth embodiment of the present invention has both the mute function in the first embodiment and the mute function in the third embodiment together. The mute function in the first embodiment in FIG. 12 can be realized by simply adding the AND circuit 20 and the NAND circuit 21 to the PRZ signal generator 2 to thus set the resistance values of the resistor elements, which are connected to the inverter circuits 14, 15, to predetermined values. However, one-bit NRZ signal being supplied from the $\Sigma \Delta$ modulator 1 includes high frequency out-of-band noises with the large amplitude. Therefore, there has been such a problem that, although the variation in the output average DC potential because of ON/OFF of the mute operation can be prevented, the click sounds because of the high frequency noises are caused. Normally, such click sounds are very small rather than the audible click noise. However, if the D/A converter is employed in such a system, e.g., the hi-fi audio device, that even minute click sounds becomes an issue, it is impossible to ignore such small click sounds.

In contrast to the above, since the mute function of the third embodiment executes the mute operation on the output side of the filter amplifier 18, the high frequency out-of-band noises with the large amplitude peculiar to one bit NRZ signal can be sufficiently suppressed. Accordingly, generation of the click sounds which has become an issue in the above first embodiment can be prevented in the third embodiment. However, even when the analog switch 22 is brought into its conductive state, i.e., even when the mute operation is ON, the filter amplifier 18 has a small gain via ON resistance of the analog switch 22. Normally, such gain is −60 dB to −40 dB. For this reason, the output of the D/A converter cannot be perfectly shut off in the filter amplifier 18. This causes no problem if the operation of the D/A converter is normal and also the input digital signal is zero data. Nevertheless, such small gain becomes an issue if the operation of the D/A converter is not usual and thus abnormal noises are generated, as in the state which is created after the power supply is turned on and before system RESET. In many cases, normally such abnormal noises have a full scale amplitude. Therefore, in case the mute operation is carried out to prevent the abnormal noises, such abnormal noises cannot be prevented satisfactorily by the presence of leakage of the output. This fourth embodiment can compensate respective drawbacks of the mute function in the first embodiment and the mute function in the third embodiment, and also implement the high performance mute function.

Figure 23:
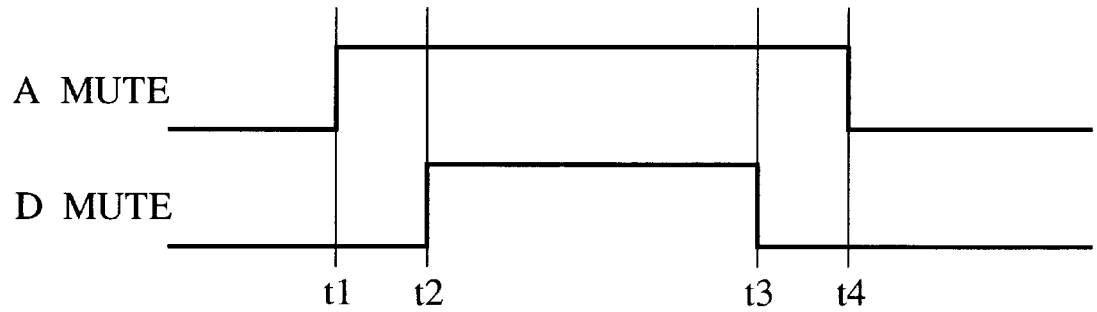
FIG. 23 is a timing chart of a D mute signal for controlling ON/OFF of a D mute operation and an A mute signal for controlling ON/OFF of an A mute operation.

FIG. 22 shows a configuration of an over-sampling D/A converter according to the fourth embodiment of the present invention. As shown in FIG. 22, this D/A converter has both the mute function in the first embodiment (called as "D mute" hereinafter) and the mute function in the third embodiment (called as "A mute" hereinafter). FIG. 23 shows a timing chart of a D mute signal for controlling ON/OFF of the D mute operation and an A mute signal for controlling ON/OFF of the A mute operation. To begin with, when the mute operation is ON, first the A mute operation is turned ON at the time t1, and then the D mute operation is turned ON at the time t2. Next, when the mute operation is OFF, first the D mute operation is turned OFF at the time t3, and then the A mute operation is turned OFF at the time t4. According to the mute operation, not only generation of the click noise can be prevented, but also output leakage of the D/A converter can be shut off perfectly.

A resistance value r' of the reference potential generator 23 is set to a different value from that in the third embodiment. This is because, as calculated in the first embodiment, the average DC potential which is supplied from the filter amplifier 18 is $(\frac{1}{2}+L)VDD-2Vos$ in the fourth embodiment whereas such average DC potential is $(\frac{1}{2}+L)VDD-Vos$ in the third embodiment. If this $(\frac{1}{2}+L)VDD-2Vos$ is set as VREF in Eq. (20) in the third embodiment, $$(\tfrac{1}{2}+L)VDD-(\beta/2)VDD=(\tfrac{1}{2}+L)VDD-2Vos$$

$$(\beta/2)VDD=2Vos$$

$$\therefore \beta=4Vos/VDD$$

$$\therefore r'=(4Vos/VDD)R5 \qquad (21)$$

Then, it can be seen that, by comparing this Eq. (21) with Eq. (12) in the first embodiment, a relationship between r' and R5 indicated by Eq. (21) is identical to a relationship between r and Ri indicated by Eq. (12). Therefore, a value which satisfies the following equation may be employed as r'.

$$r'/R5=r/Ri \qquad (22)$$

or $$(R5+r')/(R5-r')=(Ri+r)/(Ri-r)$$

Although the mute function in the first embodiment is applied as the D mute function in the fourth embodiment, the mute function in the second embodiment may be employed. In this case, a ratio of r to Ri calculated in the second embodiment may be employed as a ratio of r' to R5.

(FIFTH EMBODIMENT)

Figure 24:
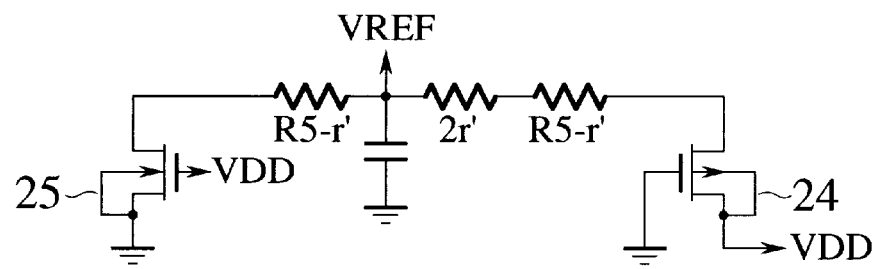
FIG. 24 is a circuit diagram showing a configuration of a reference potential generator according to a fifth embodiment of the present invention.

Next, a fifth embodiment of the present invention will be explained hereinbelow. FIG. 24 shows a configuration of a reference potential generator according to the fifth embodiment of the present invention. In this fifth embodiment, the reference potential generator 23 is connected to the power supply voltage VDD via the p-type MOS transistor and also connected to the ground voltage GND via the n-type MOS transistor in the third embodiment shown in FIG. 21 and the fourth embodiment shown in FIG. 22.

Figure 25:
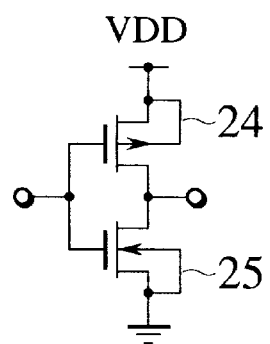
FIG. 25 is a circuit diagram showing an example of a configuration of an inverter circuit.

Normally, the inverter circuits 14, 15 are constructed by a CMOS inverter circuit shown in FIG. 25. The reference potential generator 23 in the fifth embodiment is connected to the power supply voltage VDD via a p-type MOS transistor having the substantially same size (same gate length, same gate width) as a p-type MOS transistor 24 which constitutes the CMOS inverter circuit, and also connected to the ground voltage GND via an n-type MOS transistor having the substantially same size (same gate length, same gate width) as an n-type MOS transistor 25 which constitutes the CMOS inverter circuit. For example, if the D mute signal becomes the "H" level in the D/A converter in FIG. 22, the p-type MOS transistor in the inverter circuit 14 and the n-type MOS transistor in the inverter circuit 15 are turned ON. In this case, a configuration of a circuit which is formed of a loop of the inverter circuit 14, the resistor element 16b, the resistor element 16a, the resistor element 17a, and the inverter circuit 15 becomes identical to that of the reference potential generator 23. In other words, the potential at the connection point between the resistor element 16a and the resistor element 17a coincides perfectly with the potential of an (+) input of the filter amplifier 18, including the ON resistances of the MOS transistors. Hence, according to the above configuration, offset cancel error in the filter amplifier 18 due to variation in the ON resistances of respective MOS transistors constituting the inverter circuits 14, 15 can be eliminated. As a result, the small audible click noise generated by the variation in the output average DC potential of the filter amplifier 18, which is caused by such error, can be removed and therefore the higher performance mute operation can be accomplished.

Various modifications will become possible for those skilled in the art after receiving the teachings of the present disclosure without departing from the scope thereof.

What is claimed is:

1. An over-sampling D/A converter, comprising:
   (a) a Σ Δ modulator for receiving a multibit digital signal to which a DC offset value is added, and outputting a first one-bit digital signal;
   (b) a signal generator for receiving the first one-bit digital signal and a clock signal, generating a second digital signal, which is a logical multiplication of the first one-bit digital signal and the clock signal, and a third digital signal, which is a logical addition of the first one-bit digital signal and an inverted signal of the clock signal, and adding the second digital signal to the third digital signal to thus output a fourth digital signal; and
   (c) an analog filter for receiving the fourth digital signal and outputting an analog signal;
   wherein the analog filter includes a mute unit which short-circuits a feedback resistor element in a filter amplifier constituting the analog filter and sets a potential of the analog signal as a reference potential of the filter amplifier, and
   the reference potential is set substantially equal to an average DC potential of the fourth digital signal.

2. An over-sampling D/A converter of claim 1, wherein the first digital signal is a non-return-to-zero signal,
   the second digital signal is a return-to-zero signal,
   the third digital signal is a complementary signal of the return-to-zero signal, and
   the fourth digital signal is a polar-return-to-zero signal.

3. An over-sampling D/A converter of claim 2, wherein the mute unit is composed of an analog switch for controlling whether or not the feedback resistor element is short-circuited based on a mute signal.

4. An over-sampling D/A converter of claim 3, wherein the analog switch is composed of a transmission gate which is constructed by connecting a p-type MOS transistor and an n-type MOS transistor in parallel across the feedback resistor element, an inverted signal of the mute signal is input into a gate terminal of the p-type MOS transistor, and the mute signal is input into a gate terminal of the n-type MOS transistor.

5. An over-sampling D/A converter of claim 2, wherein the reference potential of the filter amplifier is generated by a predetermined high potential supplied via a first resistor element and a predetermined low potential supplied via a second resistor element.

6. An over-sampling D/A converter of claim 5, wherein resistance values of the first resistor element and the second resistor element are set such that the reference potential becomes substantially equal to the average DC potential of the fourth digital signal.

7. An over-sampling D/A converter of claim 6, wherein a p-type MOS transistor of a substantially same size to a p-type MOS transistor, which constitutes inverter circuits for outputting the second digital signal and the third digital signal respectively, is connected between the first resistor element and a first power supply for supplying the predetermined high potential, and
   an n-type MOS transistor of a substantially same size to an n-type MOS transistor, which constitutes the inverter circuits, is connected between the second resistor element and a second power supply for supplying the predetermined low potential.

8. An over-sampling D/A converter, comprising:
   (a) a Σ Δ modulator for receiving a multibit digital signal to which a DC offset value is added, and outputting a first one-bit digital signal;
   (b) a signal generator for receiving the first one-bit digital signal and a clock signal, generating a second digital signal, which is a logical multiplication of the first one-bit digital signal and the clock signal, and a third digital signal, which is a logical addition of the first one-bit digital signal and an inverted signal of the clock signal, and adding the second digital signal to the third digital signal to thus output a fourth digital signal; and
   (c) an analog filter for receiving the fourth digital signal and outputting an analog signal;
   wherein the signal generator has a first mute unit which sets the second digital signal to a first potential and the third digital signal to a second potential and fixes the fourth digital signal at a predetermined potential, the predetermined potential being set substantially equal to an average DC potential of the fourth digital signal,
   the analog filter includes a second mute unit which short-circuits a feedback resistor element in a filter amplifier constituting the analog filter and sets a potential of the analog signal as a reference potential of the filter amplifier, the reference potential being set substantially equal to the average DC potential of the fourth digital signal.

9. An over-sampling D/A converter of claim 8, wherein the first digital signal is a non-return-to-zero signal,
   the second digital signal is a return-to-zero signal,
   the third digital signal is a complementary signal of the return-to-zero signal, and
   the fourth digital signal is a polar-return-to-zero signal.

10. An over-sampling D/A converter of claim 9, wherein the first potential is a high potential, and the second potential is a low potential.

11. An over-sampling D/A converter of claim 9, wherein the first potential is a low potential, and the second potential is a high potential.

12. An over-sampling D/A converter of claim 9, wherein the signal generator adds the second digital signal to the third digital signal at a rate which corresponds to the DC offset value.

13. An over-sampling D/A converter of claim 12, wherein the signal generator adds the second digital signal supplied via the first resistor element to the third digital signal supplied via the second resistor element, and
   resistance values of the first resistor element and the second resistor element are set such that the predetermined potential becomes substantially equal to the average DC potential of the fourth digital signal.

14. An over-sampling D/A converter of claim 9, wherein the second mute unit is composed of an analog switch for controlling whether or not the feedback resistor element is short-circuited based on a mute signal.

15. An over-sampling D/A converter of claim 14, wherein the analog switch is composed of a transmission gate which is constructed by connecting a p-type MOS transistor and an n-type MOS transistor in parallel across the feedback resistor element, an inverted signal of the mute signal is input into a gate terminal of the p-type MOS transistor, and the mute signal is input into a gate terminal of the n-type MOS transistor.

16. An over-sampling D/A converter of claim 9, wherein, when a mute operation is ON, first a second mute operation is turned ON by the second mute unit and then a first mute operation is turned ON by the first mute unit, and when the mute operation is OFF, first the first mute operation is turned OFF by the first mute unit and then the second mute operation is turned OFF by the second mute unit.

17. An over-sampling D/A converter of claim 13, wherein the reference potential of the filter amplifier is generated by a predetermined high potential supplied via a third resistor element and a predetermined low potential supplied via a fourth resistor element.

18. An over-sampling D/A converter of claim 17, wherein resistance values of the third resistor element and the fourth resistor element are set such that the reference potential becomes substantially equal to the average DC potential of the fourth digital signal.

19. An over-sampling D/A converter of claim 18, wherein a ratio of resistance value between the third resistor element and the fourth resistor element is substantially equal to a ratio of resistance value between the first resistor element and the second resistor element.

20. An over-sampling D/A converter of claim 18, wherein a p-type MOS transistor of a substantially same size to a p-type MOS transistor, which constitutes inverter circuits for outputting the second digital signal and the third digital signal respectively, is connected between the third resistor element and a first power supply for supplying the predetermined high potential, and an n-type MOS transistor of a substantially same size to an n-type MOS transistor, which constitutes the inverter circuits, is connected between the fourth resistor element and a second power supply for supplying the predetermined low potential.

* * * * *